(12) United States Patent
Dona et al.

(10) Patent No.: US 7,296,519 B2
(45) Date of Patent: Nov. 20, 2007

(54) METHOD AND DEVICE FOR TRANSFERRING A PATTERN FROM STAMP TO A SUBSTRATE

(75) Inventors: Marinus Josephus Jakobus Dona, Eindhoven (NL); Martin Hillebrand Blees, Eindhoven (NL); Michel Marcel Jose Decre, Eindhoven (NL); Patrick Petrus Johannes Van Eerd, Eindhoven (NL); Richard Joseph Marinus Schroeders, Eindhoven (NL); Teunis Johannes Antonius Heijmans, Eindhoven (NL); Christiaan Leonard Jozef Janssen, Eindhoven (NL); Peter Jan Slikkerveer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 24 days.

(21) Appl. No.: 10/515,687

(22) PCT Filed: May 26, 2003

(86) PCT No.: PCT/IB03/02003

§ 371 (c)(1),
(2), (4) Date: Nov. 24, 2004

(87) PCT Pub. No.: WO03/099463

PCT Pub. Date: Dec. 4, 2003

(65) Prior Publication Data

US 2005/0173049 A1 Aug. 11, 2005

(30) Foreign Application Priority Data

May 27, 2002 (EP) .................................. 02077079
May 27, 2002 (EP) .................................. 02077087

(51) Int. Cl.
*B41L 3/08* (2006.01)
(52) U.S. Cl. .................... 101/486; 101/450.1; 101/327; 101/453; 101/29; 101/406; 264/293
(58) Field of Classification Search ................ 101/486, 101/450.1, 327, 453, 29, 406, 127; 345/107; 264/293
See application file for complete search history.

(56) References Cited

U.S. PATENT DOCUMENTS

| 1,527,921 | A | * | 2/1925 | Rodriguez | 101/380 |
| 5,352,651 | A | * | 10/1994 | Debe et al. | 503/227 |
| 5,669,303 | A | * | 9/1997 | Maracas et al. | 101/327 |
| 5,799,576 | A | * | 9/1998 | Koike et al. | 101/111 |
| 6,129,016 | A | * | 10/2000 | Rehkemper et al. | 101/327 |
| 7,037,458 | B2 | * | 5/2006 | Ford | 264/293 |
| 7,117,790 | B2 | * | 10/2006 | Kendale et al. | 101/327 |
| 2002/0043170 | A1 | * | 4/2002 | Bronstein et al. | 101/453 |
| 2002/0144614 | A1 | * | 10/2002 | Toyama | 101/327 |
| 2005/0178280 | A1 | * | 8/2005 | Lee et al. | 101/453 |

* cited by examiner

*Primary Examiner*—Ren Yan
*Assistant Examiner*—Matthew Marini

(57) ABSTRACT

The invention relates to a method for transferring a pattern from a stamping surface (31) of a stamp (30) to a receiving surface (21) of a substrate (20). The pattern is transferred to the receiving surface (21) by successively bringing portions of the pattern within such a range of the receiving surface (21) during a certain period, that the pattern is locally transferred from the stamping surface (31) to the receiving surface (21). The individual portions can be moved by means of individual actuators (50). By applying the method, the transfer of the pattern can be performed according to a wave, which is for example ring-shaped, moving from the center of the receiving surface (21) to the circumference, or linear, moving from side of the receiving surface (21) to an opposite side.

9 Claims, 11 Drawing Sheets

METHOD AND DEVICE FOR TRANSFERRING A PATTERN FROM STAMP TO A SUBSTRATE

The present invention relates to a method for transferring a pattern from a stamping surface of a stamp to a receiving surface of a substrate.

Such a method is generally applied in the field of soft lithographic printing, wherein the features of the pattern to be transferred are in the micron and sub micron range.

According to the state of the art, there are two printing principles according to which a method for transferring a pattern from a stamp to a substrate can be performed.

The first printing principle comprises pressing two sheets against each other, wherein the two sheets contact each other through a plane. An important advantage of this first printing principle is that the alignment of the two sheets with respect to each other can be performed very accurately. Further, after the sheets have been pressed together, they stick together as a result of Van der Waals forces and can not easily be separated. An important disadvantage of this printing principle is that on moving of the sheets towards each other, air may be entrapped between the sheets. As a result, the transfer of the pattern may be incomplete.

The second printing principle comprises rolling of a cylinder along a sheet, wherein the cylinder and the sheet contact each other along a line. An important advantage of this printing principle is that air gets displaced on rolling of the cylinder, so that entrapment of air bubbles between the cylinder and the sheet will not occur, and the transfer of the pattern will not be interrupted. Also, the cylinder and the sheet do not stick together, contrary to two sheets. An important disadvantage of this second printing principle is that it is very difficult to align the cylinder and the sheet with respect to each other in an accurate way. Therefore, it is very difficult to reproduce the movement of the cylinder along the sheet two or more times, which is necessary in cases where the substrate needs to be provided with two or more layers.

In practice, several methods are being developed in trying to combine the advantages and overcome the disadvantages of the above-mentioned first and second printing principles.

Such a method is for example known from U.S. Pat. No. 5,669,303. In the known method, a flexible stamp is applied, which has a stamping surface including a pattern, wherein the stamping surface is flat in an unstressed condition. The flexible stamp is positioned above a support structure, such that the stamping surface opposes a surface of said support structure, and is secured along its circumference. Further, an article is placed onto the surface of the support structure, such that a surface of the article opposes the stamping surface. Both the stamping surface and the article are within a pressure-controlled chamber filled with gas. Initially, the pressure in the chamber equals the pressure acting on a back surface of the flexible stamp, which is the atmospheric pressure. After the stamping surface is wetted with a fluid, the stamping surface is brought into contact with the surface of the article by reducing the pressure of the gas within the chamber. The process of reducing the pressure is performed in a controlled manner, so that contact between the stamping surface and the surface of the article commences at the center of the flexible stamp and proceeds outwardly away from the center. In this way, the stamping surface is controllably contacted with the surface of the article, so that the pattern of the stamping surface is stamped onto the surface of the article.

When the pressure in the chamber is reduced, a pressure differential is established across the flexible stamp. As a result, the flexible stamp bulges in the direction of the article, wherein the center of the flexible stamp contacts the article at first. After the entire pattern has been stamped onto the surface of the article, the flexible stamp is removed from the article by increasing the pressure of the gas within the chamber. The process of increasing the pressure is performed in a controlled manner, so that the flexible stamp peels off from the surface of the article without distorting the pattern of the layer of fluid.

From the above, it will be understood that the known method combines the advantages of both the printing principle of rolling of a cylinder along a sheet and the printing principle of pressing two sheets against each other. Alignment of the stamp with respect to the article can be performed in an accurate manner, since the stamping surface is initially flat. Entrapment of air bubbles does not occur, since contact between the stamping surface and the surface of the article commences at the center of the flexible stamp and proceeds outwardly away from the center. However, the known method has an important drawback, which does not occur with one of the above-mentioned first and second printing principles. Since contact between the stamp and the article is established in a direction going from the center of the stamp toward the circumference, and peeling off of the stamp is performed in the opposite direction, it will be readily understood that portions of the surface of the article near the center contact the pattern over a longer period of time than portions near the circumference. This could cause unevenness in the pattern of the layer of fluid on the article.

It is an object of the present invention to overcome the disadvantages of the above-mentioned first and second printing principles as well as the above-mentioned drawback of the known method for transferring a pattern from a stamp to a substrate. Said object is achieved in a new method for transferring a pattern from a stamping surface of a stamp to a receiving surface of a substrate, wherein at least one of the stamping surface and the receiving surface is flexible, said new method comprising the following steps: positioning the stamp and the substrate with respect to each other, in such a way that the stamping surface and the receiving surface face each other; fixing the positions of the stamp and the substrate with respect to each other in a direction in which the receiving surface extends; moving a first portion of at least one of the stamping surface and the receiving surface forward and backward in a direction substantially perpendicular to the receiving surface, such that during a first transfer period a first transfer area is created between the stamping surface and the receiving surface, in which the stamp is able to locally transfer the pattern to the substrate; and subsequently moving a second portion of at least one of the stamping surface and the receiving surface forward and backward in a direction substantially perpendicular to the receiving surface, such that during a second transfer period a second transfer area is created between the stamping surface and the receiving surface, in which the stamp is able to locally transfer the pattern to the substrate.

According to the present invention, as time proceeds, individual transfer areas are created between the stamping surface and the receiving surface by successively moving portions of at least one of the surfaces in a direction substantially perpendicular to the receiving surface. According to the state of the art as known from U.S. Pat. No. 5,669,303, a different process takes place, wherein one transfer area is created which at first expands and later diminishes.

In applying the method according to the present invention, it is possible to control the movements of the portions of at least one of the stamping surface and the receiving surface in such a way that the transfer period is the same for all portions. This is an important advantage of the present invention, since in this way an equal pattern on the receiving surface can be obtained.

Another advantage of the present invention is that during the transfer of the pattern no air bubbles will be entrapped between the stamping surface and the receiving surface, due to the fact that the portions are successively moved. Even in case of both the stamping surface and the receiving surface being substantially flat, air will not be present in the transfer areas, since air is allowed to be displaced during creation of the transfer areas.

Yet another advantage of the present invention is that the pressing force can be controlled in an accurate manner. The present invention offers the possibility of individually controlling the pressing force for every portion of the pattern.

In applying the method according to the invention, contact between the entire stamping surface and the entire receiving surface does not occur. As a result, the problem known from the first printing principle, being that after the sheets have been pressed together they stick together and can not easily be separated, does not occur. It is advantageous, if the duration of the first transfer period and the duration of the second transfer period are substantially equal to each other. This provides a uniform transfer of the pattern. With a method this equalness of duration of the transfer periods can be easily realized, due to the excellent control of the pressure, whereas in the prior art such equalness is a matter of careful operation.

In an embodiment the first transfer period and the second transfer period partly overlap. This is advantageous in order to reduce the time needed for the transfer of the pattern. Further on, it may stabilize the transfer.

In a further embodiment, the first portion and the second portion are adjacent portions. This allows, in particular in combination with a partial overlap of the transfer periods, a printing procedure analogous to the flowing of a transversal wave.

In this respect the pattern may be transferred according to various shapes. Thus, the second transfer area may be shaped like a ring, providing a circular propagation of the wavelike transfer. Alternatively, the first and second area are linear and are aligned parallel to each other.

However, the shape is not limited to a wave. Particularly, the individual portions or sets of individual portions transferred do not need to be neighboring. In particular, such allows the use of one stamp, of which dots can be printed as desired. The pattern of dots to be printed can be prescribed using known control device, particularly a computer comprising a control program with at least one desired pattern to be printed on the receiving surface. This leads to a printing type which is comparable to conventional desktop or inkjet printing, achieving a resolution of typically 1 µm currently. However this resolution may be further improved. One could call this digital microcontactprinting. This embodiment further allows to print successively several patterned layers on a receiving surface of a substrate, different layers having different patterns, wherein all layers are printed by utilizing a single stamp.

In another embodiment, the stamping surface is provided as a role rolling around a first axis and a second axis, which axes are substantially parallel to the receiving surface. In this embodiment there is in fact a plurality of portions of the stamping surface, that are substantially linear and aligned parallel to each other. In the method, each of those portion is first moved forward so as to create a transfer area and finally being moved backward. As will be understood, while moving the portion forward and backward it is turned around an angle.

In the meanwhile that the transfer area is available there is a number of other transfer areas being formed and deleted. The specific transfer area therewith has a place in a row, that changes from the last one to the first one or vice versa. The stamp therewith moves over the receiving surface in the direction perpendicular to the axes. Pressing of the stamping surface towards the receiving surface can be realized with the first and second axes. However, further axes may be present to enable a tighter pressure.

An advantage of this embodiment has the advantage that the transfer periods corresponding to the portions of the stamp surface overlap substantially. As a result the total time needed for the transfer of a pattern the receiving surface will reduce. It is a further advantage of this embodiment that it is suitable for reel-to-reel printing on a flexible receiving surface. This reel-to-reel printing is considered to be an interesting option for printing of displays and other relatively large-area consumer electronics devices.

The method of transferring a pattern to a receiving surface of a substrate according to the invention can be used as part of the manufacturing of any electronic device as is desired. Examples of such devices include displays, integrated circuits, optical recording media, biosensors, printed circuit boards, microelectronic components such as couplers, switches, acoustic wave filters. In case of integrated circuits, it is particularly suitable for integrated circuits on the basis of thin-film transistors. The substrate material is not critical. It is an advantage of the method that it can be applied on substrate surfaces which are not completely planar. This advantage originates in that the individual portions move in a direction substantially perpendicular to the substrate surface, and they can be moved at one location somewhat further than at another location at the substrate surface. The ability to provide layers on surfaces which are not completely planar allows to leave out some polishing steps, and may improve the adhesion between the substrate surface and the layer to be applied thereon.

It is a further advantage of the method that no clean room conditions are necessary for its application. This allows the use of the method in much broader circumstances. Preferred examples include assembly factories for packages of electronic devices, particularly integrated circuits, and factories for printed circuit boards.

It is another advantage of the method that it is not limited to the transfer of monolayers, as is the case in microcontactprinting. It has turned out that the method is applicable with success for the transfer of bulk layers, and particularly of fluid layers. These layers may be applied either on the stamping surface or on the receiving surface.

An important and surprising feature of this embodiment of the method is, that the fluid layer may be structured during the actual transfer of the pattern. Then, before transfer the fluid layer is unpatterned and extends over substantially the complete surface. The fluid layer is patterned by bringing it into contact with the other surface at a local area. This is assumed due to the use of the forward and backward movement of individual portions of the stamping surface. Through this movement a pressure is exerted on the fluid layer, which is sufficiently large to overcome the cohesive forces in the fluid layer itself. The actual transfer happens then as a result of differences in surface energy between the first surface and the other surface. Of course it is possible that the transfer is a two step method, wherein first a fluid layer is transferred from a carrier to the stamping surface according to the pattern present at the stamping surface or utilized. Thereafter the pattern can be transferred to the receiving surface.

An excellent transfer is achieved when the fluid layer has been made or has become sufficiently viscous after its application. Then the flow any fluid in a direction laterally to the surface is virtually absent. The increase of viscosity can be realized by active or passive evaporation of the solvent. Diffusion of the solvent into the stamp can be an alternative process or an additional factor.

It is preferred that the fluid layer comprises a polar solvent and that the first surface has a character that is less strong electrophilic than the other surface. Suitable polar solvents include alcohols, alkoxyethers and water. With the difference in electrophilicity the balance of forces can be managed adequately, so as to optimize the transfer of the pattern. With this method resolutions in the order of I micrometer has been achieved, and the limitation of the resolution is mainly in the proper alignment. The small differences in height appear to be sufficient. If desired, the stamp may have may have recesses at the stamping surface with cross-sections that become smaller as the distance to the stamping surface increases. Such a stamp is known from WO-A 01/59523 and has excellent stability of the patterns.

The transfer of fluid bulk layers can be used for a variety of applications, including precursor polymers, sol-gel materials, photoresist materials and organic materials with for instance dielectric or semiconductor properties.

It is furthermore an advantage of the method of the invention, that there is only a limit degree of freedom during the transfer. Particularly, alignment between the stamp and the substrate must be achieved in the two transversal directions parallel to the plane of the receiving surface and the in-plane rotation. The freedom in the direction normal to the receiving surface is absent, in view of the contact between the receiving surface, the fluid layer and the stamping surface during transfer. This contact furthermore increases resolution as compared to jet printing, in which fluid is jetted at a certain distance to the substrate in a direction which is only perfectly normal to the receiving surface in the ideal case.

The present invention also relates to an apparatus for transferring a pattern from a stamping surface of a stamp to a receiving surface of a substrate. The apparatus suitable for the method of the invention comprises a stamp having a stamping surface including a pattern, and means which are arranged so as to enable individual portions of at least one of the stamping surface and the receiving surface to successively move forward and backward in a direction substantially perpendicular to the receiving surface.

It is advantageous that the means are individually controllable. Further on, they are preferably are arranged so as to act in a direction substantially perpendicular to the receiving surface.

The means can be a variety of means to provide pressure in a direction substantially perpendicular to the receiving surface. For instance, the means may comprise channels being associated with vacuum chambers.

An implementation hereof is that the apparatus comprises a three-layered system. The first layer thereof includes the stamp with the stamping surface. The stamp, for instance of the polydimethylsiloxane (PDMS) material, is preferably attached to a bendable layer. This is for instance a polymer layer, but may alternatively be a thin layer of glass. The second layer comprises nozzles through which air or another fluid or particularly gas can flow. The nozzle is for instance a channel in a direction substantially perpendicular to the layer and at the interface of the first and the second layer, a broadened part of the channel. The third layer comprises valves and supply channels. This layer also comprises means for addressing the valves individually. It can be suitably embodied by providing the necessary structures in a glass plate. The first and the second layer are held together by vacuum.

This apparatus operates in the following manner. Before starting the transfer of the pattern, the stamping surface is brought near the substrate at a distance of about 0.01-1 mm, preferably around 0.1-0.3 mm. In this situation the nozzles are under a pressure lower than the standard pressure, particularly lower than atmospheric pressure. Under addressing of the valves according to a desired pattern, particularly a linear or a circular wave, the valves are then individually opened and closed. The opening of a valve has as a consequence, that the gas or air will flow into the nozzle and press the stamping surface against the substrate. It is particularly preferred to use compressed air. It is furthermore preferred that the gas pressure when the valves are opened is still under the atmospheric pressure. Good results have been obtained with an underpressure of 25-40 mbar underpressure in the closed state and 5-10 mbar underpressure in the opened state. The gas pressure and the time that a valve is opened, particularly between 0.001 and 0.1 seconds, can be optimized as desired.

It is an advantage of this embodiment that the gas pressure can be easily varied. This pressure variation can be lateral (transverse to the printing direction), principal (along the printing direction) and/or temporal (variation in time during the printing process). In this way, the local printing pressure is easily adapted to the needs of the features to be printed, therewith allowing extreme flexibility in the position and dimension of printable features. This is particularly important for electronic devices, such as patterned layers for integrated circuits, displays and biosensors, where both patterns with rather small dimensions (in the micrometer or sub micron range) and large dimensions (in the order of 10-100 microns) need to be printed, and in which the distance between the individual pattern may vary from the sub micron range up to the millimeter range.

In a preferred embodiment the means comprise a plurality of actuators, each actuator being associated with an individual portion of at least one of the stamping surface and the receiving surface. In a further embodiment each actuator comprises a pin. This is advantageous in order to transfer the pattern to the receiving surface in a wave-like manner.

The apparatus of the invention may further comprise aligning means for aligning the stamping surface and the receiving surface with respect to each other. It may for instance be that transparent inspection windows are provided in the stamp.

The present invention also relates to a stamp having a stamping surface including a pattern.

A stamp having a stamping surface including a pattern is known, for example from U.S. Pat. No. 5,669,303. The known stamp is flexible and is shaped like a sheet. In an unstressed condition, the stamping surface is flat.

In order to be able to be utilized in a process of transferring the pattern to a receiving surface of a substrate without entrapping air bubbles, the flexible stamp needs to be secured along its circumference and to be bulged in the direction of the receiving surface. The stamping surface and the receiving surface need to be positioned with respect to each other in such a way that on bulging of the stamp, the stamping surface contacts the receiving surface. In this way, contact between the stamping surface and the receiving surface commences at the center of the stamp and proceeds outwardly away from the center, so that entrapment of air bubbles is prohibited.

According to the state of the art, bulging of the stamp is performed by placing the stamping surface in a pressure-controlled chamber. When the pressure in the chamber is equal to the pressure acting on a back surface of the stamp, which is the atmospheric pressure, the stamping surface is flat. When the pressure in the chamber is reduced to a level below the atmospheric pressure, the stamp bulges in an inward direction, that is in a direction toward the receiving surface.

An important disadvantage of the known stamp relates to the way in which the stamp is to be utilized. For the purpose of every stamping action which needs to be performed, a pressure difference needs to be established across the stamp.

It is an object of the present invention to overcome the above-mentioned drawback of the known stamp.

It is an object of the present invention to at least overcome the above-mentioned disadvantages of the known method for providing a receiving surface with several patterned layers. Said object is achieved in a stamp comprising a base layer containing actuators and a flexible stamping layer covering at least a part of the base layer, wherein a bottom surface of said stamping layer is partly held against the base layer and a top surface of said stamping layer comprises the stamping surface.

The stamping layer is held against the base layer everywhere, except for underneath the actuators. Utilizing the stamp according to the present invention, printing is performed by first bringing the stamping surface within sufficiently close range of the receiving surface and then actuating the actuators. E.g. means to enable the individual portions to move forward and backward. A certain portion of the stamping surface associated with a certain actuator is pushed out by actuating the actuator in an outward direction, that is a direction towards the receiving surface, whereas the portion is retracted by actuating the actuator in an inward direction, that is a direction opposite to the outward direction, i.e. a direction away from the receiving surface. Only the portions which are pushed out make contact with the receiving surface or at least come within sufficiently close range to be able to leave a print on the receiving surface.

In this way of printing, it is possible to create individual print areas between the stamping surface and the receiving surface, as time proceeds, by successively moving portions of the stamping surface towards the receiving surface.

Utilization of the stamp according to the present invention has many advantages, a number of which will be mentioned below.

A first advantage of the present invention relates to the fact that the specific design of the stamp enables successive movement of portions of the stamping surface, as mentioned in the above. As a result, during a printing action, no air bubbles will be entrapped between the stamping surface and the receiving surface. Even in case of both the stamping surface and the receiving surface being substantially flat, air will not be present in the print areas, since air is allowed to be displaced during creation of the print areas.

A second advantage of the present invention also relates to the fact that the portions may be successively moved, wherein contact between the entire stamping surface 31 and the entire receiving surface 21 does not occur. As a result, the problem known from the first printing principle, being that after the sheets have been pressed together they stick together and can not easily be separated, does not occur.

A third advantage of the present invention is that the pressing force can be controlled in an accurate manner. The present invention offers the possibility of individually controlling the pressing force for every portion of the stamping layer, by individually controlling the force being applied by the actuators.

A fourth advantage of the present invention is that any pattern can be applied using one single stamp. As long as the portions associated with the actuators are sufficiently small, any pattern can be created by determining which portions need to be pushed out and which portions do not need to be utilized.

A fifth advantage of the present invention is that contact between a portion of the stamping surface and the receiving surface can easily be detected, since the actuator associated with the portion will experience a quickly rising counter-force when the portion touches the receiving surface. This enables the control of the displacement of each portion separately, which makes a printing action less sensitive to non-flat substrates and/or stamps.

A sixth advantage of the present invention is that the movements of the portions of the stamping surface can be controlled by a computer, whereby it is possible to correct for alignment errors by simply utilizing other portions. Further, if the substrate is deformed as a result of, for instance, stretching or heating, the pattern can be adjusted for the deformation, also by utilizing different portions.

A seventh advantage is that the actuators can comprise capillaries which can be used as ink channels, whereby printing molecules are constantly fed by diffusion through the stamp.

The present invention will now be explained in greater detail with reference to the Figs., in which similar parts are indicated by the same reference signs, and in which:

FIG. 1 diagrammatically shows a perspective view of an apparatus for transferring a pattern from a stamp to a substrate according to a first preferred embodiment of the present invention;

FIG. 2 diagrammatically shows a sectional view of the apparatus which is shown in FIG. 1;

FIG. 3 diagrammatically shows a detail A of the apparatus according to FIG. 2;

FIG. 4 diagrammatically shows a sectional view of an apparatus for transferring a pattern from a stamp to a substrate according to a second preferred embodiment of the present invention;

Figure 8:
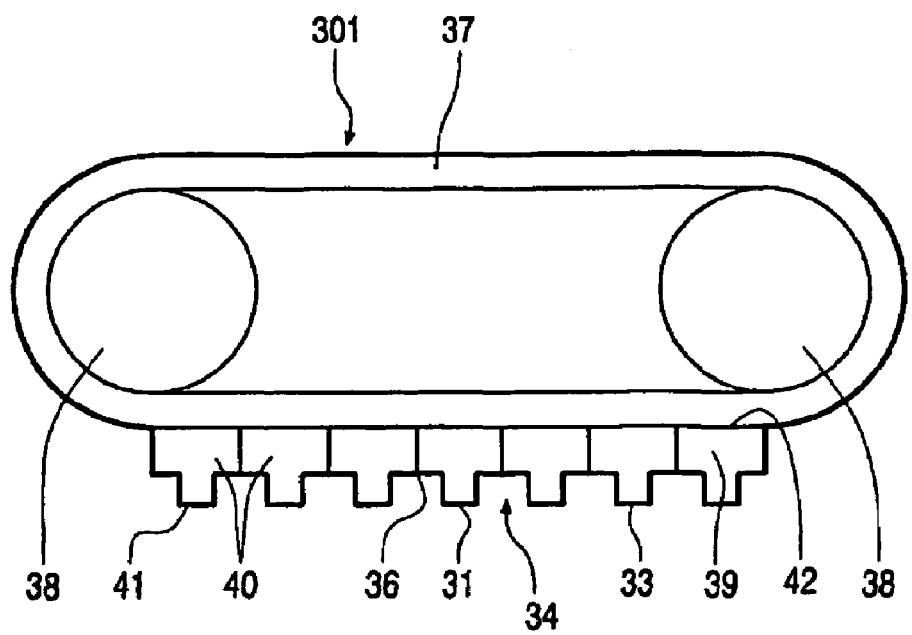
Figure 9:
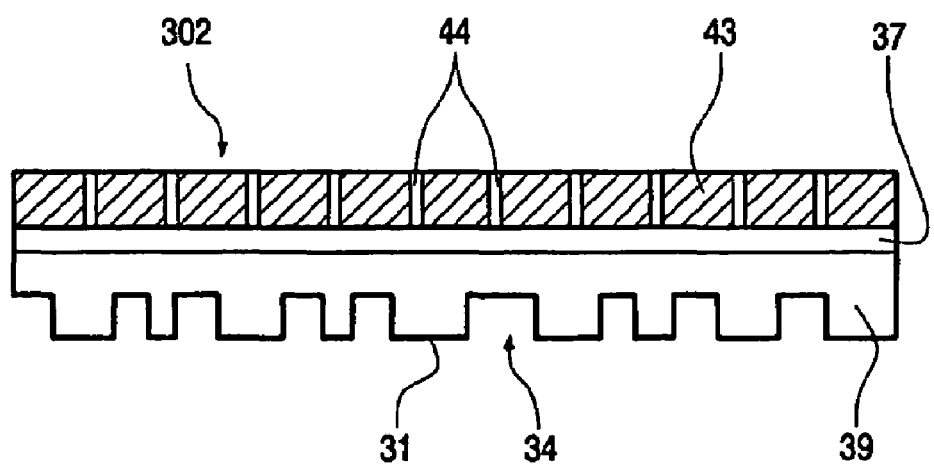
Figure 10:
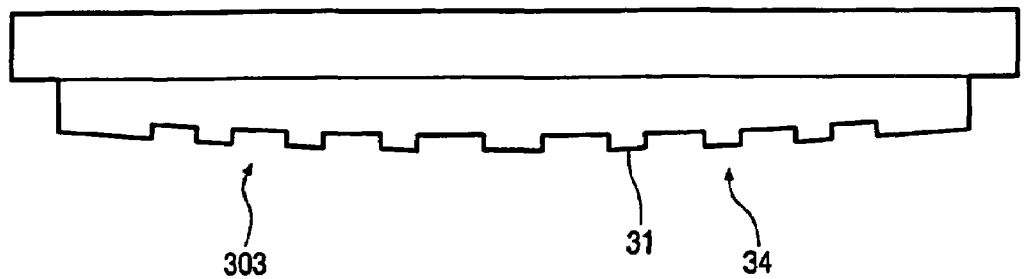

FIG. 8 diagrammatically shows a sectional view of a stamp having a stamping surface including a pattern according to a first preferred embodiment of the invention;

FIG. 9 diagrammatically shows a sectional view of a stamp having a stamping surface including a pattern according to a second preferred embodiment of the invention;

FIG. 10 diagrammatically shows a sectional view of a stamp having a stamping surface including a pattern according to a third preferred embodiment of the invention; and FIGS. 11-14 illustrate steps of a method for manufacturing the stamp which is shown in FIG. 10.

Figure 15:
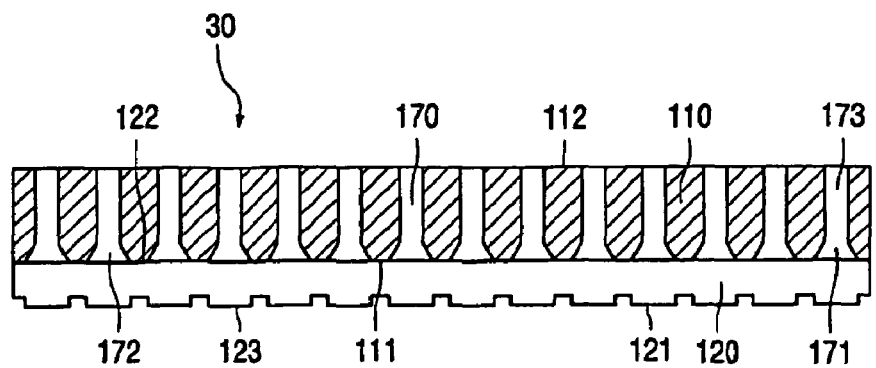
Figure 16:
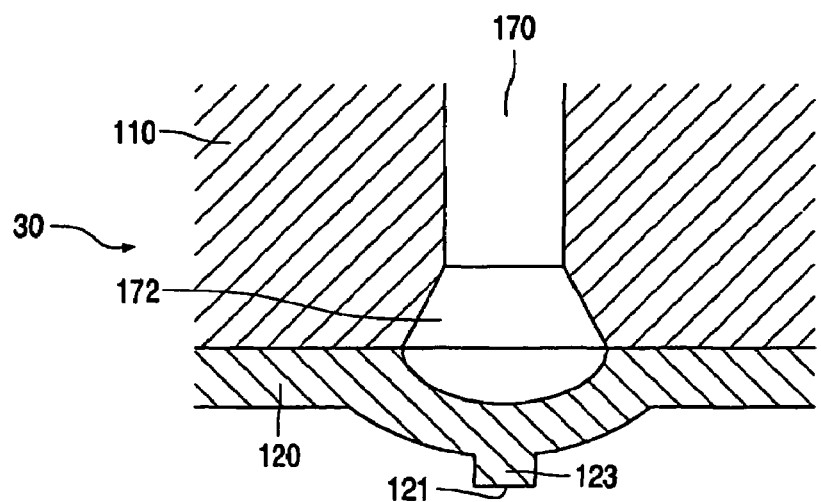
Figure 17:
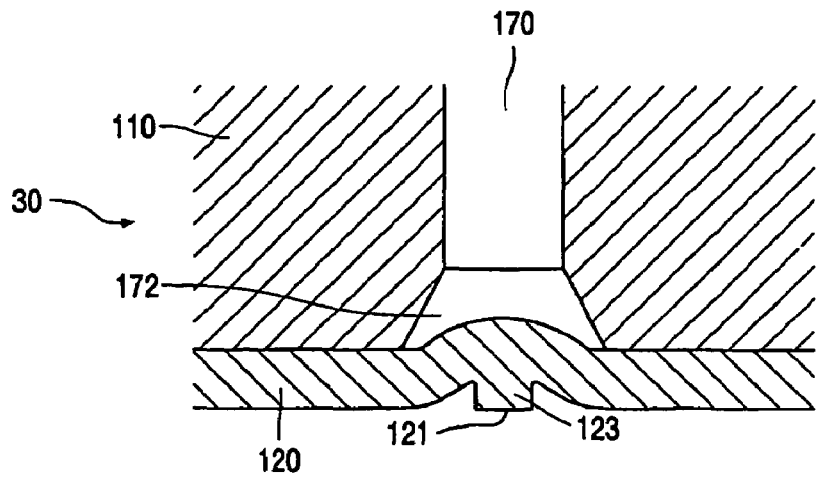
Figure 18:
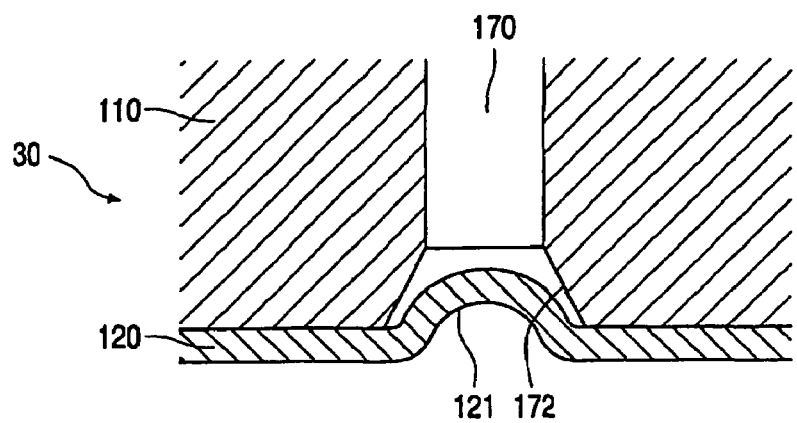
Figure 19:
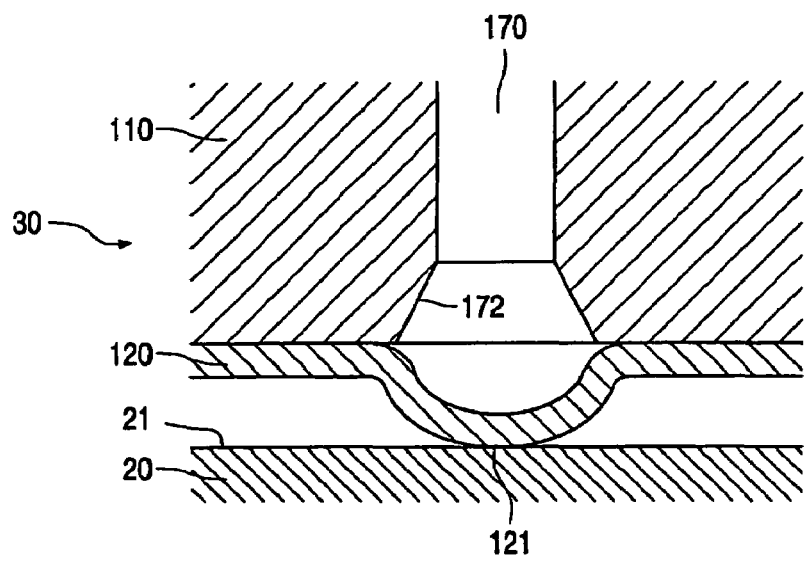
Figure 20:
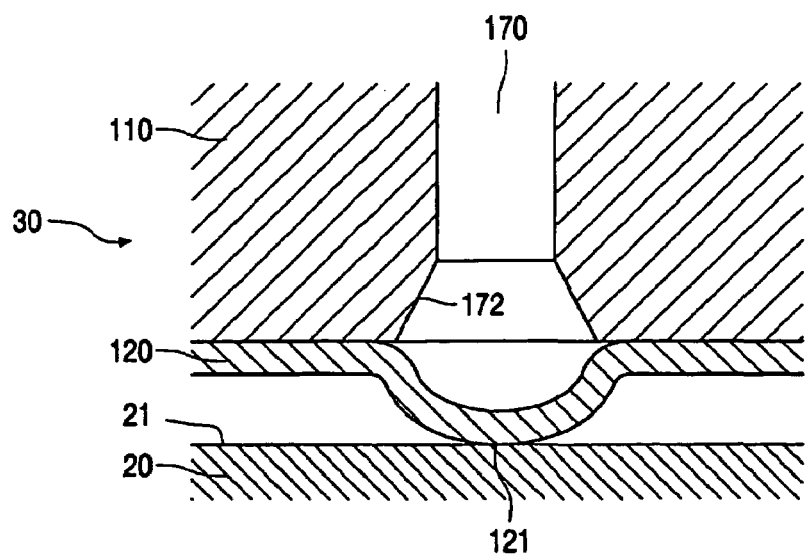
Figure 21:
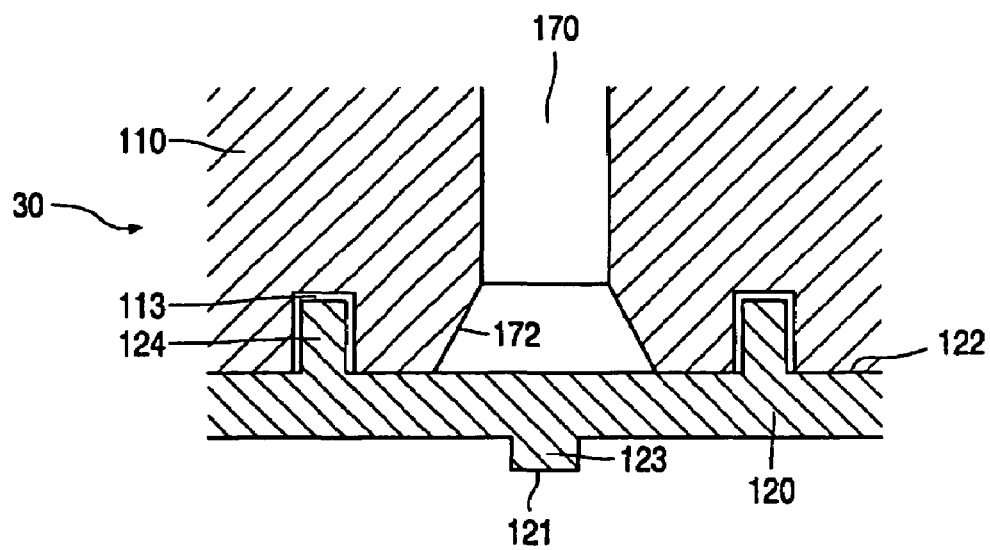
Figure 22:
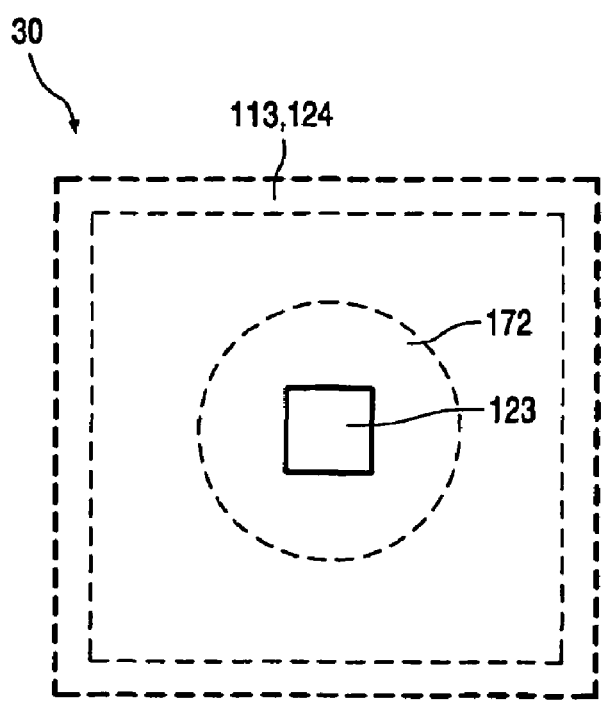
Figure 23:
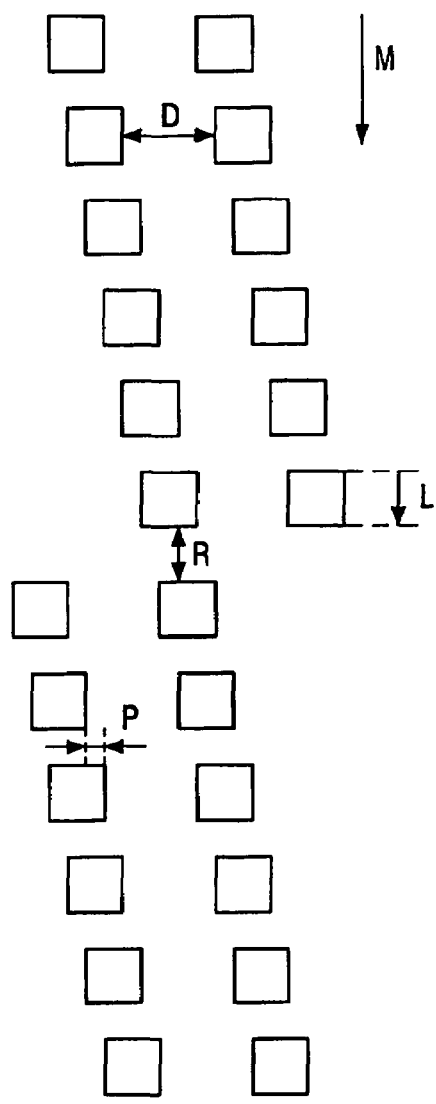
Figure 24:
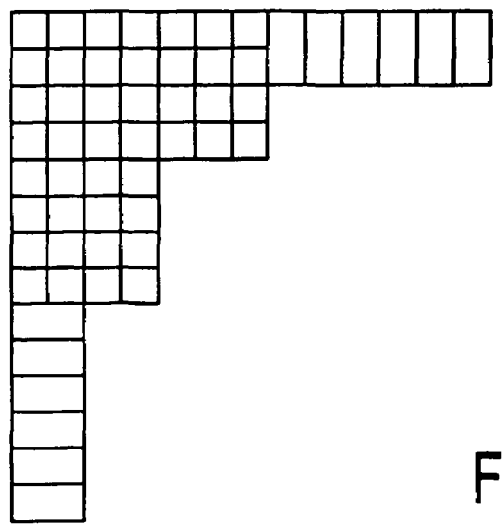

FIG. 15 diagrammatically shows a sectional view of a stamp according to a fourth preferred embodiment of the present invention;

FIG. 16 diagrammatically shows a sectional view of a portion of the stamp according to the fourth preferred embodiment of the present invention in a pushed out position;

FIG. 17 diagrammatically shows a sectional view of a portion of the stamp according to the fourth preferred embodiment of the present invention in a retracted position;

FIG. 18 diagrammatically shows a sectional view of a portion of a stamp according to a fifth preferred embodiment of the present invention in a rest position;

FIG. 19 diagrammatically shows a sectional view of a portion of the stamp according to a fifth preferred embodiment of the present invention in a pushed out position, as well as a portion of a substrate;

FIG. 20 diagrammatically shows a sectional view of a portion of the stamp according to a fifth preferred embodiment of the present invention in an enhanced pushed out position, as well as a portion of a substrate;

FIGS. 21 and 22 illustrate a preferred way in which a stamping layer of the stamp according to the present invention is fixed on a base layer of said stamp;

FIG. 23 shows a possible alignment of printing dots being provided on a stamping surface of the stamp according to the present invention; and FIG. 24 shows a possibility of a pattern which can be obtained utilizing a stamp having printing dots which are aligned in a way according to FIG. 23.

Figure 1:
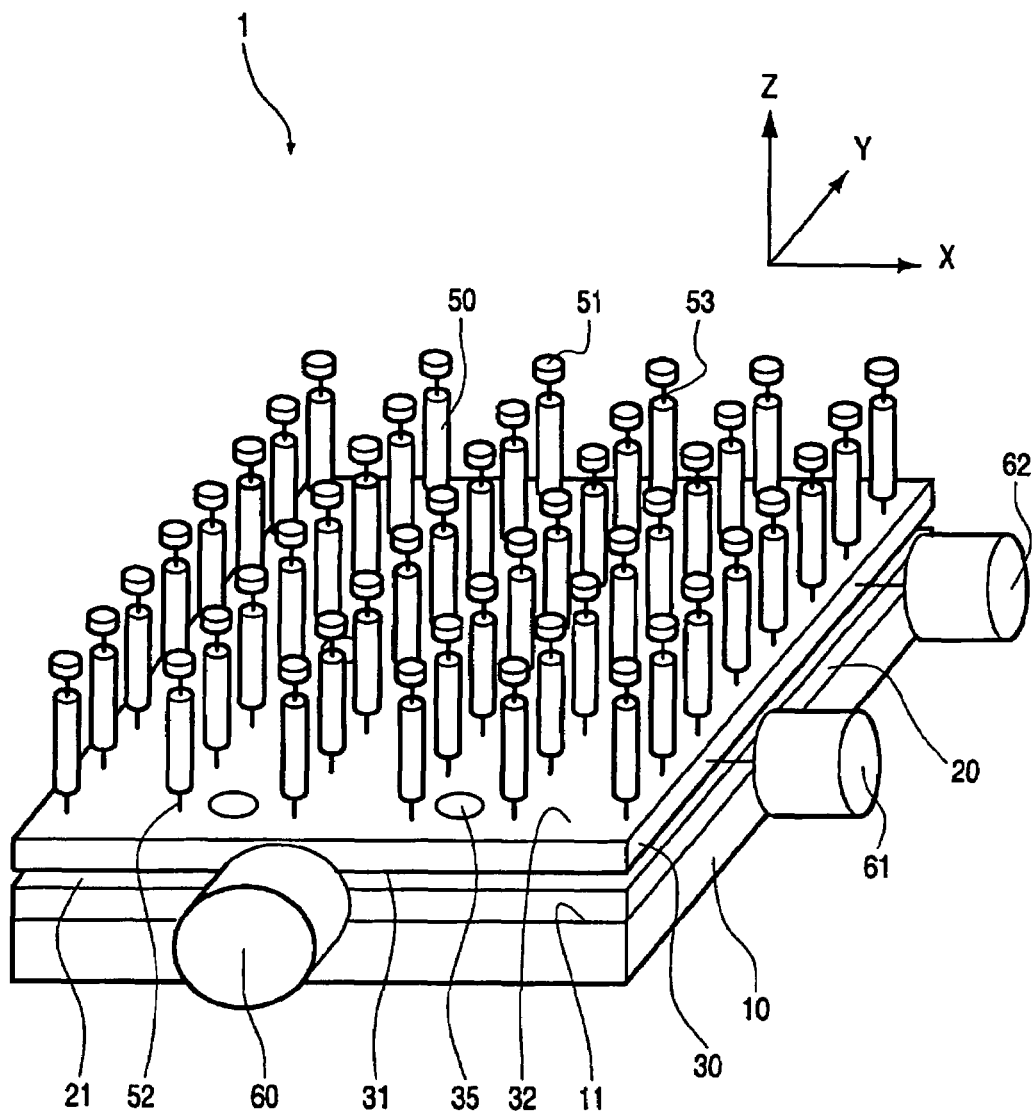
Figure 2:
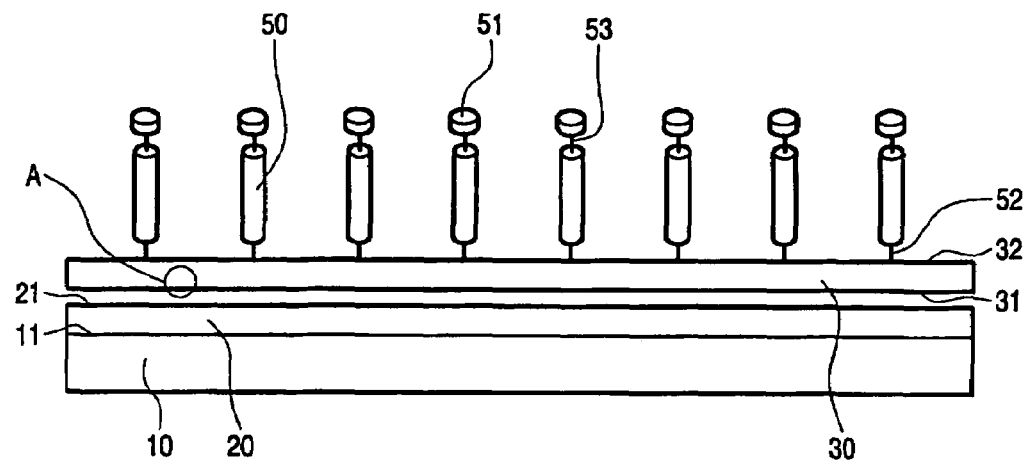

FIGS. 1 and 2 diagrammatically show an apparatus 1 for transferring a pattern from a stamp to a substrate according to a first preferred embodiment of the present invention.

The apparatus 1 comprises a table 10 having a supporting surface 11 for supporting a substrate 20 having a receiving surface 21. Further, the apparatus includes a flexible stamp 30. The stamp 30 is shaped like a sheet, having a stamping surface 31 and an outer surface 32.

Figure 3:
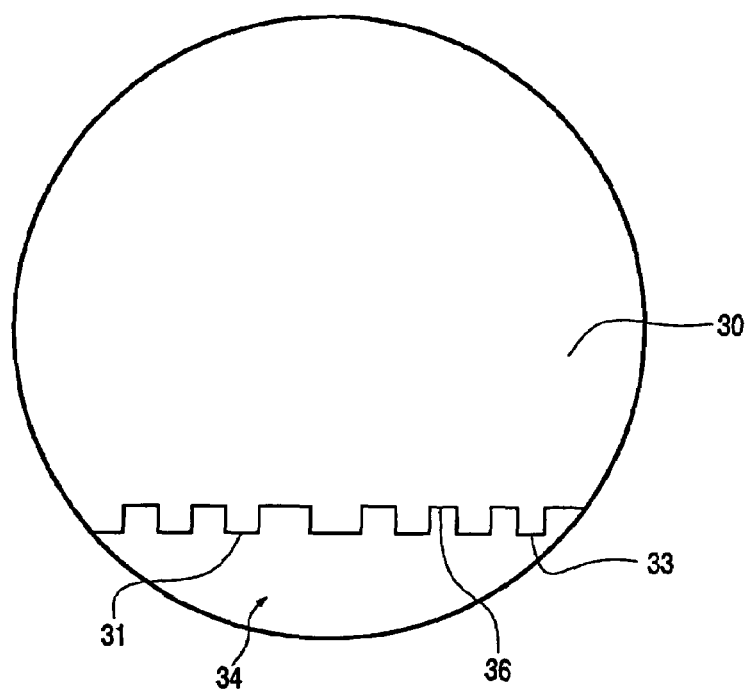

Referring to FIG. 3, the stamping surface 31 includes transferring surfaces 33 which define a pattern 34 to be transferred onto the receiving surface 21 of the substrate 20. The features of the pattern 34 may be in the micron and sub micron range.

The stamp 30 is positioned in such a way that the stamping surface 31 faces the supporting surface 11. In case of a substrate 20 being placed onto the supporting surface 11, the stamping surface 31 faces the receiving surface 21, as is shown in FIG. 2.

For the purpose of alignment of the pattern 34 and the receiving surface 21 of a substrate 20 being placed onto the supporting surface 11, the stamp 30 is provided with transparent inspection windows 35. The position of the stamp 30 with respect to the table 10 can be adjusted by means of three positioning wheels 60, 61, 62, wherein each of said wheels 60, 61, 62 is part of a device (not shown) for moving the stamp 30 in its entirety in a predetermined direction. In the shown example, the stamp 30 can be moved in a first direction in the plane of the stamping surface 31 by means of positioning wheel 60, in a second direction in said plane by means of positioning wheel 61, the second direction being perpendicular to the first direction, and in a third direction perpendicular to said plane by means of positioning wheel 62. In the following, the first-direction is referred to as x-direction, the second direction is referred to as y-direction and the third direction is referred to as z-direction. In FIG. 1, the x-direction is indicated by arrow x, the y-direction is indicated by arrow y and the z-direction is indicated by arrow z.

In a more elaborate embodiment, there are more than three positioning wheels, and particularly six positioning wheels. A first set of three positioning wheels then allows to position the stamp in the x-direction, in the y-direction and with regard to the angle around the z-axis. The second set of three positioning wheels allows to position the stamp in the z-direction, and with regard to the angles around the x-axis and the y-axis. Of course, other implementations apparent to the skilled person may be used as well.

In order to improve the aligning of the stamp and the surface, use can be made of additional alignment means, which are known in the field of semiconductor equipment. It is particularly preferred to use cameras as alignment means together with alignment features both in the substrate and in the pattern at the stamping surface. Such a camera can be provided inside or at the backside of the apparatus, if this apparatus is transparent. The materials can be chosen such, that this is the case, particularly in the embodiment in which the individual portions are driven with pressure differences.

The alignment features may be corresponding or complementary and have a shape as desired, for instance a star, a stripe, a cross or the like. It is particularly preferred to provide alignment features not only near the edges of a complete pattern, but also within the pattern, and particularly in between of individual devices or device parts (for instance display pixels).

The provision of such alignment features within the pattern to be printed is possible for such printing, as here, in contrast to photolithography, it is not necessary to transfer every detail within the pattern, e.g. some parts of the pattern could be skipped during the wave printing.

The provision of such alignment features is also particularly useful for such wave printing. The movement of the parts in a direction substantially perpendicular to the stamping surface results in some uncontrolled and undesired displacements during the printing, particularly if the stamp is a continuous (i.e. completely or primarily uninterrupted) layer. This displacement appears due to microslip and compensation errors, and is in the order of about 1 micron for a 15 cm plate. By implementing such alignment features between individual parts or devices and aligning during the printing, this misalignment can be reduced to the order of 0.1 microns or even less. This very small misalignment is achieved in that the distance between the substrate and the stamping surface and thus the distance between the patterns to be aligned is very small, e.g. generally in the order of 0.01 to 1 mm, particularly about 0.05 to 0.2 mm.

Due to such improved alignment and the possibility to vary the pressure as desired, the resolution of the features at the stamping surface may be improved as to in the submicronrange, and corresponding to the field in which is at the frontier of the possibilities of pattern transfer with photolithography.

According to the present invention, the apparatus 1 comprises means for individually moving portions of the stamping surface 31 and/or the receiving surface 21 in a controlled way. In a particular embodiment, such means may comprise a plurality of actuators being positioned at the side of the outer surface 32 of the stamp 30, each actuator being associated with an individual stamp portion.

According to an important aspect of the present invention, each actuator can individually be activated. To this end, each actuator is coupled with a control device which controls the operation of the actuators, which control device is, however, not shown for the sake of simplicity. In principle, any suitable type of actuator may be used.

In the shown example, the actuators are simple mechanical actuators such as pins 50 each having a head 51 and a bottom 52, wherein the bottom 52 is directed toward the outer surface 32 of the stamp 30. The pins 50 extend substantially in the z-direction, and are arranged so as to be movable in said z-direction. The movement of the pins 50 can be controlled individually. The pins 50 are movably mounted in a suitable holder, which is not shown for the sake of clarity.

Preferably, the pins 50 comprise a waist part 53 in order to allow for small adjustments in the x-direction and the y-direction.

A stamping action which is performed by utilizing the apparatus 1, is described in the following.

First of all, a substrate 20 is placed onto the supporting surface 11, such that the receiving surface 21 faces the stamping surface 31. The substrate 20 is fixed with respect to the supporting surface 11 in any suitable way.

In the z-direction, the stamp 30 is brought onto a proper position with respect to the receiving surface 21 by turning the positioning wheel 62. In general, in the proper position, the distance between the stamping surface 31 and the receiving surface 21 is in the micron range. In a case wherein the pattern 34 has already been transferred to the receiving surface 21 in at least one previous stamping action, the pattern 34 on the stamp 30 needs to be aligned with respect to the pattern on the receiving surface 21. In such case, the stamp 30 is moved in the x-direction and the y-direction by turning the positioning wheels 60, 61, respectively, while the position of the pattern 34 on the stamping surface 31 with respect to the position of the pattern on the receiving surface 21 is inspected through the inspection windows 35. The stamp 30 is moved until the pattern 34 on the stamping surface 31 coincides with the pattern on the receiving surface 21. Subsequently, the position of the stamp 30 is fixed with respect to the substrate 20. In practice, if the alignment is performed in the way as described in the above, at least an accuracy of 1 μm can be achieved.

In this example, the transferring surfaces 33 are provided with an ink which is known per se. The ink comprises molecules being supplied to the transferring surfaces 33 by means of diffusion. When the transferring surfaces 33 are within close range of the receiving surface 21, molecules flow from the transferring surfaces 33 to the receiving surface 21. In this way, the pattern 34 is transferred to the receiving surface 21 without the necessity of physical contact between the transferring surfaces 33 and the receiving surface 21. It will be understood that the receiving surface 21 is made of a material which is suitable for receiving the molecules.

Subsequent to placing the substrate 20 onto the supporting surface 11 and positioning the stamp 30 with respect to the substrate 20, the pattern 34 is transferred to the receiving surface 21 by successively bringing portions of the pattern 34 within such a range of the receiving surface 21 during a certain period, that the pattern 34 is locally transferred from the stamping surface 31 to the receiving surface 21. In the process, the individual portions are being moved in the z-direction by means of the individual actuators.

There are many possibilities for the order in which the portions are successively moved. For instance, an actuator in the center of the stamp 30 can be activated first, and then adjacent actuators in the direction of the circumference of the stamp 30 can be successively activated, such that the transfer of the pattern 34 is performed according to a wave moving from the center to the circumference. Such a wave can be shaped like a ring, wherein said ring has a circular or a rectangular circumference, dependent on the arrangement of the actuators.

In the shown example, wherein the actuators comprise pins 50, rows of pins 50 can be successively moved, for example by rolling a cylinder over the heads 51. In that case, the transfer of the pattern 34 is performed according to a linear wave moving from one side of the stamp 30 to an opposite side of the stamp 30. It will be understood that this particular movement of the pins 50 can be compared to the rolling of a cylinder along a sheet. However, the difficulties regarding alignment of a cylinder with respect to a sheet are absent in the apparatus 1 according to the present invention. Instead of a cylinder, a ball or any other element having a convex surface can be rolled along the heads 51 of the pins 50.

Preferably, the apparatus 1 comprises springs or other suitable means to cause the pins 50 to move back to an initial position after the pins 50 have been forced in the direction of the stamp 30.

Within the scope of the present invention, it is possible to control the activation of the activators in such a way, that a second portion of the pattern 34 is not moved before a first portion has regained an initial position. It is also possible to move the second portion while the first portion is still in the position wherein local transfer of the pattern 34 takes place. In such case, the period during which the second portion of the pattern 34 is locally transferred partly overlaps the period during which the first portion of the pattern 34 is locally transferred.

From the above, it will be clear that the utilization of the apparatus 1 according to the present invention has important advantages, for all possible orders in which the actuators can be successively moved. As the actuators are moved successively, a situation in which all portions of the stamping surface 31 are brought within close range of the receiving surface 21 simultaneously will never occur. Consequently, entrapment of air bubbles at the portions where the pattern 34 needs to be transferred to the receiving surface 21 will never occur. Further, alignment can be performed in an accurate way, as both the stamping surface 31 and the receiving surface 21 can be flat. Also, the amount of time in which the pattern 34 is locally transferred from the stamping surface 31 to the receiving surface 21 can be the same for all portions of the pattern 34.

In the stamping action as described in the above, it is not necessary that the transfer surfaces 33 are put in physical contact with the receiving surface 21, due to the kind of ink being utilized. Within the scope of the invention, all suitable kinds of ink can be utilized. Therefore, in many applications of the apparatus 1 according to the present invention, it will actually be necessary for the stamping surface 31 or transfer surface 33 and the receiving surface 21 to contact each other. In such applications, the apparatus 1 according to the present invention offers the possibility of controlling the pressing forces acting on the individual portions of the pattern 34 to be transferred. In that way, the pressing forces can be equal for all individual portions. Controlling of the pressing forces can for instance be realized by assigning a force detector to each pin 50.

Generally, the pressing forces should be relatively low in order to avoid that the receiving surface 21 is not only contacted by the transferring surfaces 33, but also by intermediate surfaces 36.

The inspection windows 35 are not to be regarded as essential parts of the apparatus 1. Any suitable means for alignment can be incorporated in the apparatus 1. According to a simple alternative, the stamp 30 is entirely transparent.

In the apparatus 1 according to the present invention, the positions of the substrate 20 and the stamp 30 are interchangeable, in other words the stamp 30 could be placed onto the supporting surface 11 and the substrate 20 could be positioned between the stamp 30 and the actuators. In such case, the actuators act on the substrate 20, such that individual portions of the receiving surface 21 are successively brought within close range or in contact with the pattern 34 on the stamping surface 31. It will be understood that in such case, at least the substrate 20 is flexible.

FIGS. 4-7 diagrammatically show an apparatus 2 for transferring a pattern from a stamp to a substrate according to a second preferred embodiment of the present invention.

The main difference between the apparatus 1 as shown in FIGS. 1 and 2 and this apparatus 2 relates to the means for individually moving portions of the stamping surface 31 and/or the receiving surface 21 in a controlled way.

The apparatus 2 comprises a vacuum chuck 70 having a supporting surface 71. The vacuum chuck 70 is being provided with a plurality of individual vacuum chambers 72, wherein the pressure in the vacuum chambers 72 can be controlled individually. Each vacuum chamber 72 ends up with the supporting surface 71 of the vacuum chuck 70 through at least one channel 73.

Figure 4:
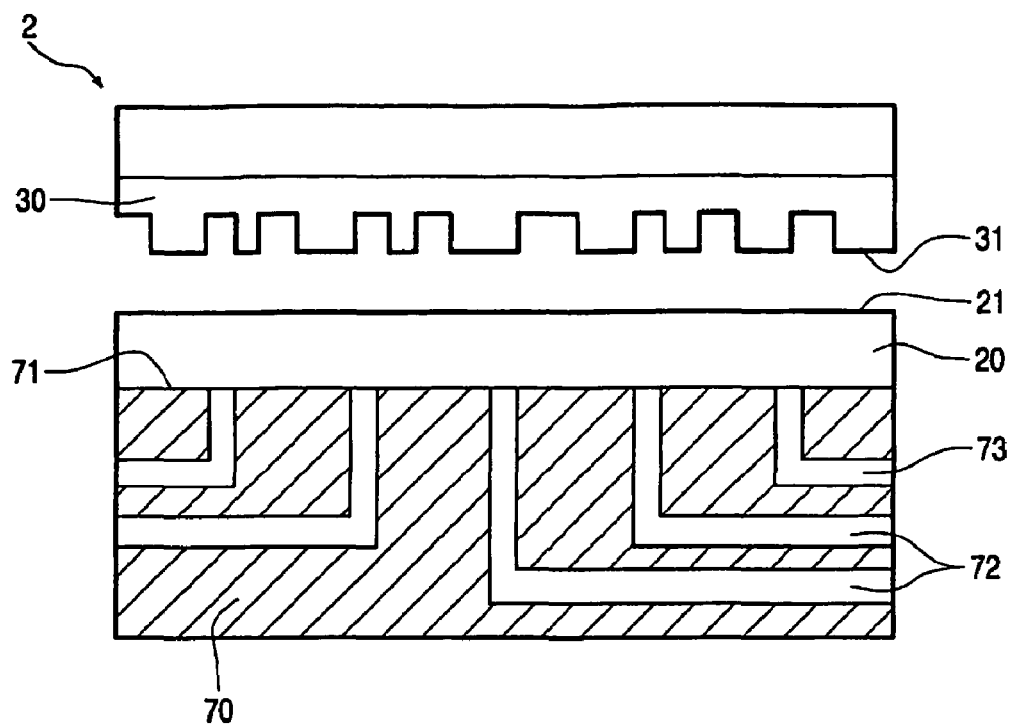

Further, the apparatus includes a stamp 30 having a stamping surface 31. In the apparatus 2, the stamp 30 is positioned in such a way that the stamping surface 31 faces the supporting surface 71. In case of a substrate 20 having a receiving surface 21 being placed onto the supporting surface 71, the stamping surface 31 faces the receiving surface 21, as is shown in FIG. 4.

Figure 5:
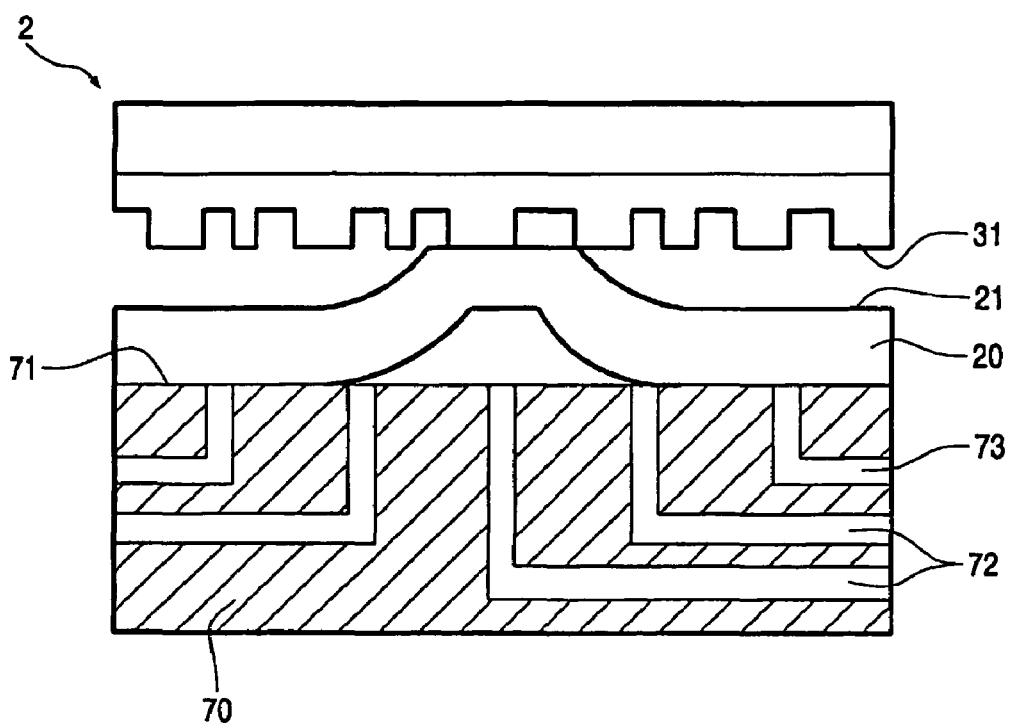
FIGS. 5 and 6 illustrate a possible application of the apparatus which is shown in FIG. 4.
Figure 6:
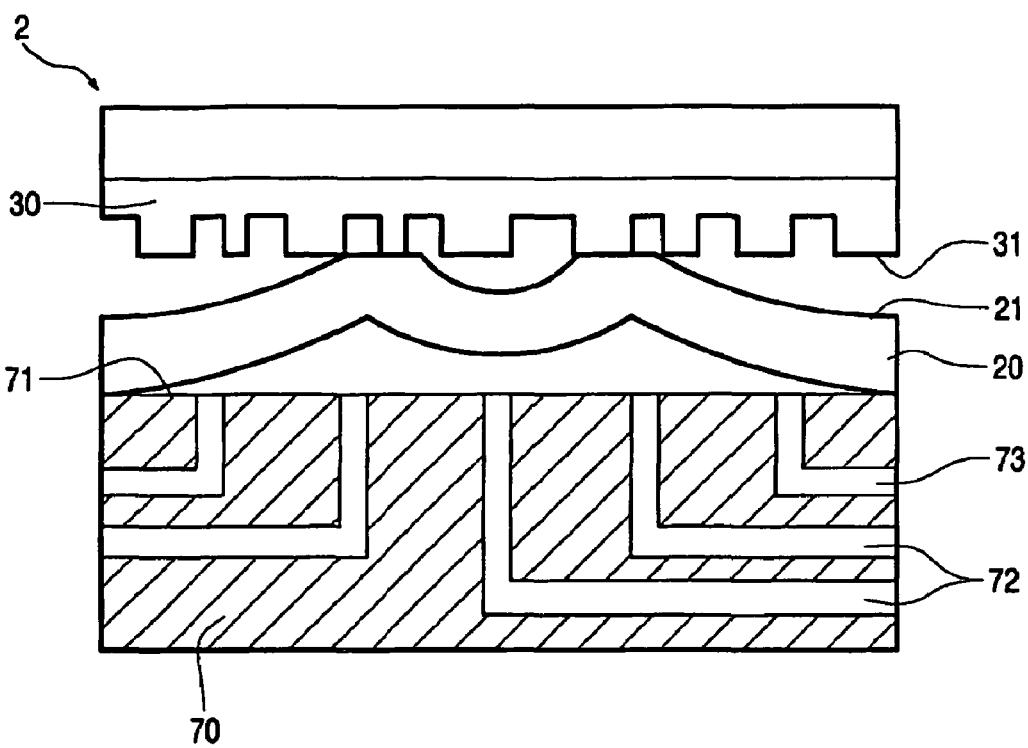

In a possible application of the apparatus 2 according to the present invention, which is illustrated in FIGS. 5 and 6, a vacuum chamber 72 being associated with a channel 73 in the center of the vacuum chuck 70 is connected to an overpressure with respect to the atmospheric pressure first, while the other vacuum chambers 72 are connected to a reduced pressure with respect to the atmospheric pressure. As can be seen in FIG. 5, this results in a center portion of the substrate 20 contacting the stamping surface 31. While the pressure in said vacuum chamber 72 being associated with the channel 73 in the center of the vacuum chuck 70 is reduced, the pressures in vacuum chambers 72 being associated with adjacent channels 73 in the direction of the circumference of the substrate 20 are increased and then reduced. This process is performed several times, in a direction from the center toward the circumference of the substrate 20, so that contact between the stamping surface 31 and the receiving surface 21 is established according to a wave moving from the center to the circumference of the substrate 20. A position wherein this wave is located between the center and the circumference of the substrate 20 is shown in FIG. 6.

Figure 7:
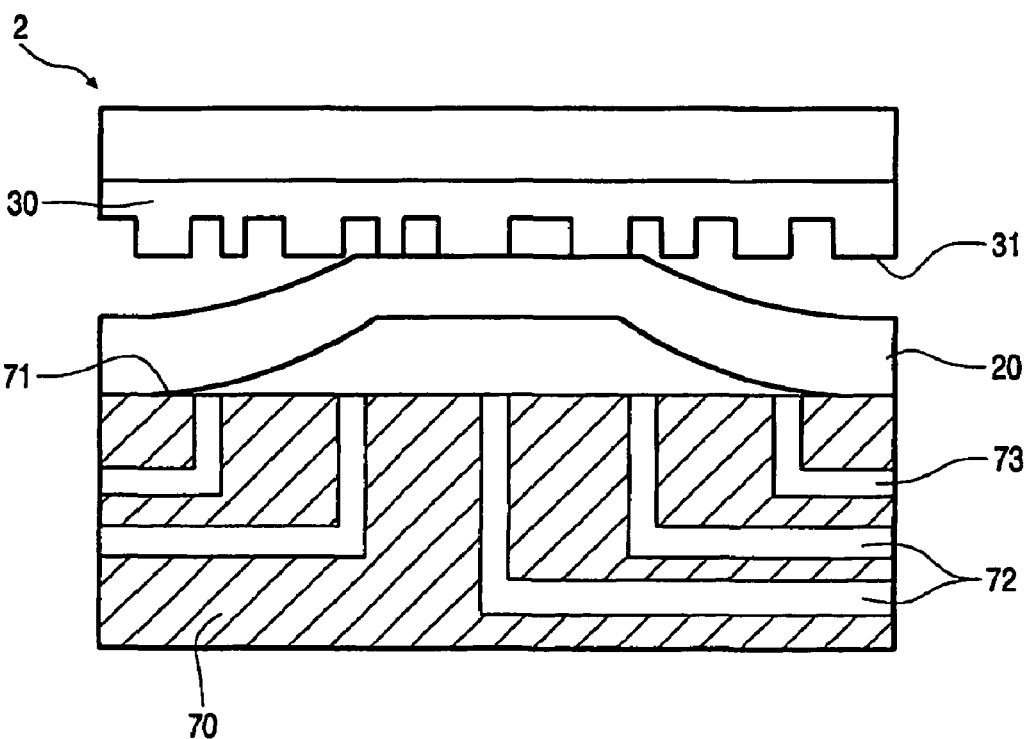
FIG. 7 illustrates another possible application of the apparatus which is shown in FIG. 4.

In another possible application of the apparatus 2 according to the present invention, which is illustrated in FIG. 7, a vacuum chamber 72 being associated with channels 73 at the circumference of the vacuum chuck 70 is connected to a reduced pressure with respect to the atmospheric pressure, while all other vacuum chambers 72 are connected to substantially the same overpressure with respect to the atmospheric pressure. This results in the substrate 20 being bulged in the direction of the stamp 30. When the stamp 30 is moved in the z-direction toward the substrate 20, contact between the stamping surface 31 and the receiving surface 21 commences at the center of the substrate 20, and proceeds outwardly away from the center. Preferably, the stamp 30 is flexible, so that it can be peeled off from the receiving surface 21 at the end of a stamping action.

In the apparatus 2 according to the present invention, the positions of the substrate 20 and the stamp 30 are interchangeable, as is the case in the apparatus 1.

In the apparatus of the invention, various stamps can be used. Preferred embodiments of such stamps will be discussed with reference to the FIGS. 8, 9, 10, 15-17 and 18-20.

FIG. 8 shows a stamp 301 having a stamping surface 31 including a pattern 34 according to a first preferred embodiment of the invention.

The stamp 301 comprises a base sheet 37 being shaped like a closed loop, which is preferably mounted on two cylinders 38, as shown in FIG. 8. At the outer periphery of the base sheet 37, a stamping layer 39 including a pattern 34 being defined by transferring surfaces 33 and intermediate surfaces 36 is provided. The stamping layer 39 is divided into adjacent individual stamping parts 40, a top 41 of which is provided with a part of the pattern 34, and a bottom 42 of which is connected to the base sheet 37. The division of the stamping layer 39 into the individual stamping parts 40 contributes to a relatively high flexibility of the stamp 301 and facilitates the moving of successive portions of the stamp 301 in the z-direction. The stamping layer 39 does not need to cover the entire base sheet 37, as only a part of a closed loop can be brought within close range or in contact with a flat surface.

The stamp 301 can for example very well be used in the apparatus 1, wherein the pins 50 are positioned in an area being enclosed by the base sheet 37. Preferably, in such case, each individual stamping part 40 is associated with one pin 50.

The base sheet 37 does not necessarily have to be shaped like a closed loop, and does not necessarily have to be mounted on two cylinders 38. Instead, the stamp 301 can be shaped like a sheet which can be secured along its circumference.

FIG. 9 shows a stamp 302 having a stamping surface 31 including a pattern 34 according to a second preferred embodiment of the invention.

The stamp 302 comprises a stamping sheet 39, a base sheet 37 and a pressure sheet 43, wherein the base sheet 37 is located between the stamping sheet 39 on the one side and pressure sheet 43 on the other side. Preferably, the base sheet 37, the stamping sheet 39 and the pressure sheet 43 are substantially flat. At least the base sheet 37 and the stamping sheet 39 are flexible.

The pressure sheet 43 is provided with a plurality of channels 44, which preferably extend in a direction perpendicular to the base sheet 37 and the stamping sheet 39. In the shown example, the length of the channels 44 corresponds to the thickness of the pressure sheet 43.

In a possible application of the stamp 302, each channel 44 is associated with a separate pressure device (not shown) for controlling the pressure in the channel 44. When the stamping surface 31 of the stamp 302 is brought into the vicinity of a receiving surface 21, individual transfer areas in which the pattern 34 is locally transferred to the receiving surface 21 are created by applying an overpressure to one or more certain channels 44, since as a result of the overpressure in a certain channel 44, a portion of the stamping surface 31 being associated with that certain channel, is moved in the direction of the receiving surface 21. When an overpressure is applied to certain channels 44, the other channels 44 are subjected to a reduced pressure, in order to keep portions of the stamping surface 31 being associated with said other channels 44 at a certain distance from the receiving surface 21.

From the above, it will be clear that by controlling the variation of the pressure in each channel 44 over time, the order in which the portions of the stamping surface 31 are successively moved in the direction of the receiving surface 21 is determined. In the above-described possible application of the stamp 302, each channel 44 is associated with a separate pressure device, so that there are many possibilities for the order in which transfer areas are created. In a less complicated application, less pressure devices are utilized, wherein channels 44 are being grouped together, all channels 44 of one group being associated with one and the same pressure device. The groups can for example be chosen in such a way, that the successive creation of transfer areas is performed according to a wave spreading from the center of the stamp 302 to the circumference.

FIG. 10 shows a stamp 303 having a stamping surface 31 including a pattern 34 according to a third preferred embodiment of the invention.

The stamping surface 31 of the stamp 303 is slightly convex, wherein a convex curvature is in a range from 50 to 100 μm, the convex curvature being defined as the difference between a highest portion of the stamping surface 31, in the center of the stamp 30, and a lowest portion of the stamping surface 31, at the circumference of the stamp 30, in the z-direction.

In a first possible application of the convex stamp 303, the convex stamp 303 is secured along its circumference, and is positioned in such a way that the stamping surface 31 faces a suitable receiving surface 21. A stamping action is started by creating a transfer area between a central portion of the stamping surface 31 and the receiving surface 21 by moving the convex stamp 303 as a whole in the direction of the receiving surface 21. Subsequently, the convex stamp 303 is subjected to pressure, in such a way that the shape of the stamping surface 31 gradually changes from convex to concave, starting from the center of the stamping surface 31. It is possible to change the shape of the stamping surface 31 by increasing the pressure acting on the stamp 303 at the side of the stamping surface 31. It is also possible to change the shape of the stamping surface 31 by reducing the pressure acting on the stamp 303 at the other side, or by changing the pressure on both sides of the stamp 303. As the shape of the stamping surface 31 changes, the stamp 303 is moved in the direction of the receiving surface 21 in order for portions of the stamping surface 31 to be close-enough to the receiving surface 21 to ensure a proper transfer of the pattern 34.

With respect to the above, it is not necessary that only the convex stamp 303 is moved during a stamping action. It is important that the convex stamp 303 and a substrate 20 having the receiving surface 21 are moved with respect to each other in such a way, that they get closer.

In this first possible application, as the shape of the stamping surface 31 changes from convex to concave, transfer areas are created according to a wave spreading from the center to the circumference of the stamp 303. An important advantage of this application is that it is possible to have substantially the same transfer period for all portions of the stamping surface 31.

In a second possible application of the convex stamp 303, a stamping action is performed by moving the stamp 303 in the direction of the receiving surface 21, wherein contact between the stamping surface 31 and the receiving surface 21 commences at the center of the stamp 303, and proceeds outwardly away from the center. After the portions at the circumference of the stamp 303 have transferred the pattern 34 to the receiving surface 21, the stamp 303 is moved away from the receiving surface 21.

With respect to the above, it is not necessary that only the convex stamp 303 is moved during a stamping action. It is important that the convex stamp 303 and a substrate 20 having the receiving surface 21 are moved with respect to each other in such a way, that first they are moved toward each other and later they are moved away from each other.

FIGS. 11-14 illustrate steps of a method for manufacturing the convex stamp 303.

Figure 11:
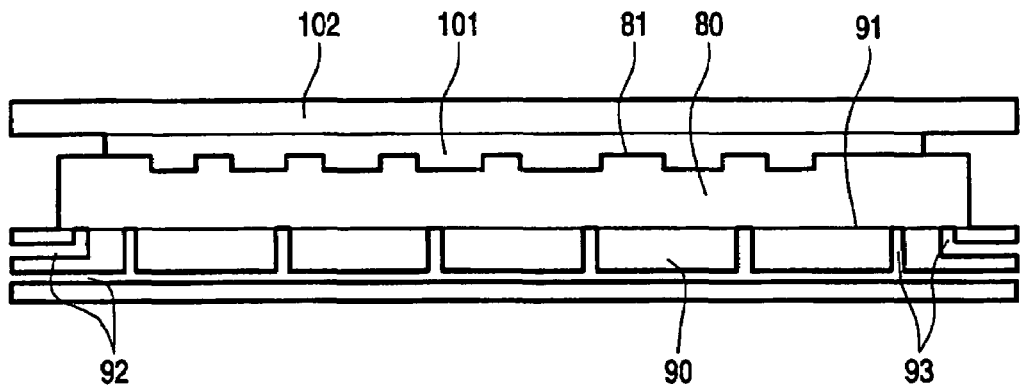

In a first step, which is illustrated by FIG. 11, a silicon master 80 having a patterned surface 81 is placed onto a supporting surface 91 of a vacuum chuck 90. The vacuum chuck 90 comprises two individual vacuum chambers 92, wherein each vacuum chamber 92 ends up with the supporting surface 91 of the vacuum chuck 90 through channels 93. A polyurethane replica layer 101 being supported by a metal foil 102 is applied to the patterned surface 81 of the master 80.

Figure 12:
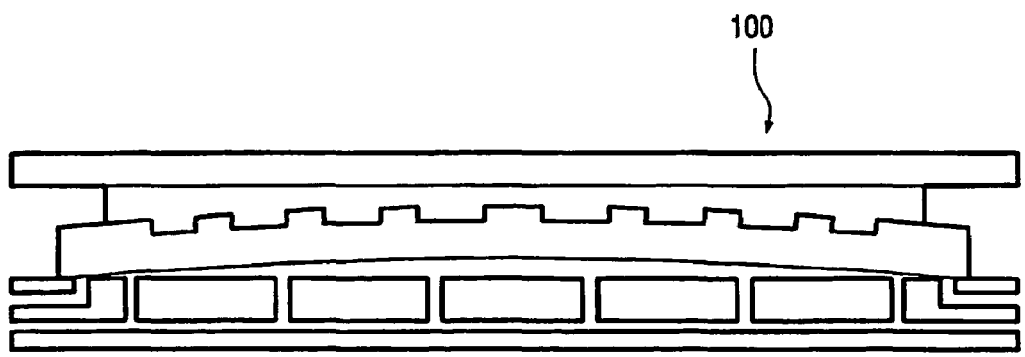

In a second step, which is illustrated by FIG. 12, the vacuum chamber 92 being associated with channels 93 at the circumference of the vacuum chuck 90 is connected to a reduced pressure with respect to the atmospheric pressure, while the other vacuum chamber 92 is connected to an overpressure with respect to the atmospheric pressure. As a result, the master 80 bulges in the direction of the replica layer 101, and the replica layer 101 is provided with a concave impression of the patterned surface 81 of the master 80. In the following, the combination of the replica layer 101 and the supporting metal foil 102 is referred to as concave replica 100.

Figure 13:
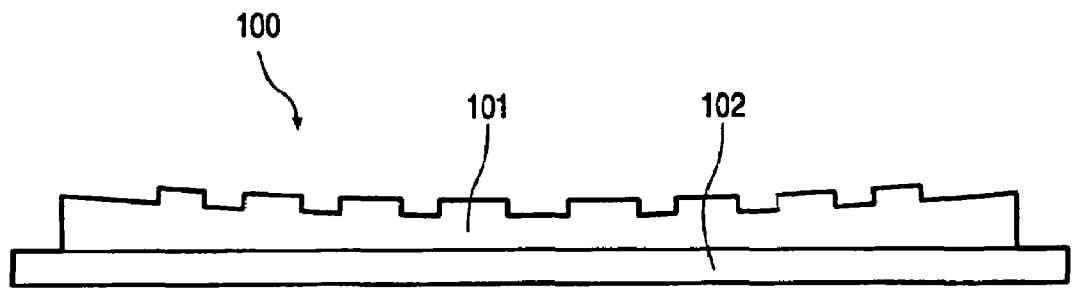

In a third step, the concave replica 100 is separated from the master 80. The concave replica 100 is shown in FIG. 13.

Figure 14:
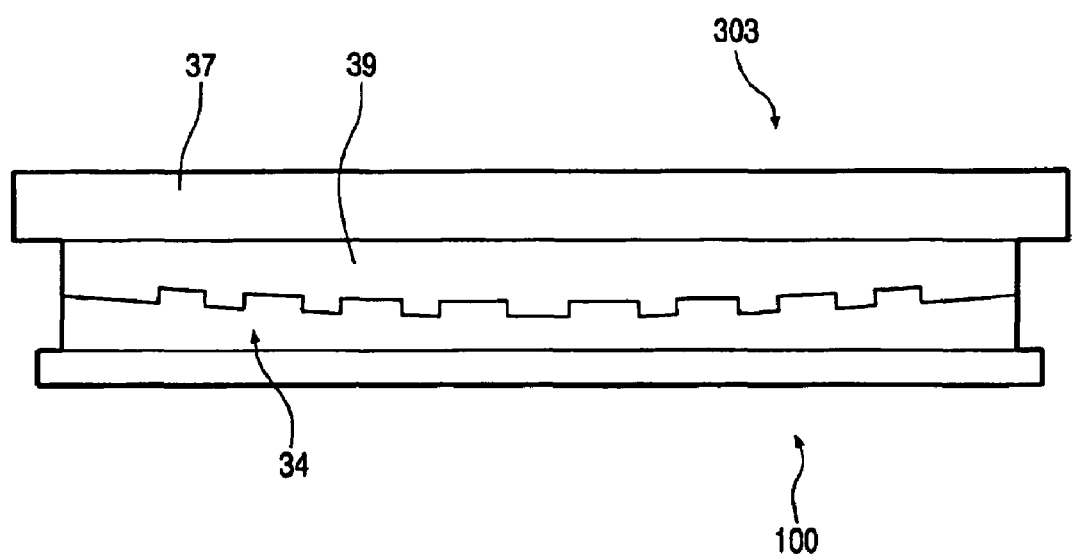

In a fourth step, which is illustrated by FIG. 14, a polydimethylsiloxane stamping layer 39 being supported by a quartz base sheet 37 is applied to the concave replica 100. Both the concave replica 100 and the combination of base sheet 37 and stamping layer 39 are mounted on a vacuum chuck (not shown), and they are brought into contact in a way which is known per se. In the process, the stamping layer 39 is provided with a convex pattern 34, and the convex stamp 303 is obtained, comprising the combination of the base sheet 37 and the stamping layer 39.

In a fifth step, the convex stamp 303 is separated from the concave replica 100.

The master 80, the concave replica 100 and the convex stamp 303 can be made from other materials than the ones described in the above, as long as the materials are suitable for the manufacturing method as well as for the possible application of the convex stamp 303.

According to the present invention, the method as described in the above is especially utilized for manufacturing convex stamps 303 having a convex curvature in a range from 50 to 100 μm. These stamps 303 have some important advantages, which become apparent during their application. For example, alignment of the convex stamp 303 with respect to a receiving surface 21 of a substrate 20 can be performed very accurately, as the alignment can be performed in substantially the same manner as the alignment of a stamp having a flat stamping surface, due to the fact that the convex curvature is relatively very small. However, the convex curvature is sufficiently big to ensure that during a stamping action entrapment of air bubbles between the stamping surface 31 and the receiving surface 21 will not occur.

FIGS. 15-17 diagrammatically show a stamp 30 according to a fourth preferred embodiment of the present invention.

In conformity with the stamp 1 as shown in FIGS. 1 and 2, the stamp 30 comprises a base layer 110 and a flexible stamping layer 120. The base layer 110 contains capillaries 170, which extend through the base layer 110 at a certain mutual distance, such that each capillary 170 is associated with an individual portion of the stamping layer 120. These individual portions are provided with a protrusion 23 having a rectangular circumference, serving as a printing dot. In the shown example, at its end 171 at the side of the top surface 111 of the base layer 110, each capillary 170 comprises a funnel 172. The length of the capillaries 170 corresponds to the thickness of the base layer 110.

The base layer 110 may be manufactured from one or more silicon wafers in which the capillaries 170 have been etched. Preferably, at its end 173 at a bottom surface 12 of the base layer 110, each capillary 170 is closed by a piezo-element (not shown), which may be constructed on a second silicon wafer.

The entire bottom surface 22 of the stamping layer 120 is held against the top surface 111 of the base layer 110, except for the portions which are associated with the capillaries 170. In order to affix the stamping layer 120 on the base layer 110, vacuum suction may be utilized, which is particularly advantageous if the stamping layer 120 has to be replaced for maintenance or because of wear.

A printing action is performed by varying the pressure in the capillaries 170. A certain printing dot 123 can be pushed out by increasing the pressure in the associated capillary 170 above the ambient pressure, whereas the printing dot 123 can be retracted by reducing the pressure in the capillary 170 below the ambient pressure. A pushed out position of a printing dot 123 is shown in FIG. 16, whereas a retracted position of a printing dot 123 is shown in FIG. 17.

The capillaries 170 may be filled with liquid or gas. Liquid is preferred, as liquid may be chosen to be the patterning ink. In such case, the stamping layer 120 is made permeable to the liquid, wherein the liquid in the capillary 170 does not only serve to exert a pressing force on portions of the stamping layer 120, but also to impregnate the stamp 30. When during a printing action the pressure in a capillary 170 is increased, an associated printing dot 123 is moved outwards as long as the pressure loss in the porous stamping layer 120 is higher than the pressure needed to actuate. At the same time, ink is oozing through the porous stamping layer 120, and exits on stamping surface 31. During physical contact between the stamping surface 31 and the receiving surface 21 printing of the receiving surface 21 takes place, wherein ink is transferred from the stamping surface 31 to the receiving surface 21. After a transient time, the pressure is reduced, because the ink has been flowing through the porous stamping layer 120, or because the pressure in the capillary 170 is reduced, and the printing dot 123 is retracted.

The pressure in the capillaries 170 is individually controlled by a suitable control device (not shown), which may comprise a computer.

In the shown example, the printing dot 123 has a rectangular circumference, whereby rectangular local contact is established between the stamping surface 31 and the receiving surface 21 during a printing action. However, another possibility is that the circumference of the printing dot 123 has a different shape, or even that the printing dot 123 is entirely left out. In the latter case, circular local contact is established between the stamping surface 31 and the receiving surface 21 during a printing action, as the circumference of the funnel 172 of the capillary 170 is circular.

FIGS. 18-20 diagrammatically show portions of a stamp 30 according to a fifth preferred embodiment of the present invention.

In this embodiment, portions of the stamping surface 31 associated with the capillaries 170 are buckled at rest, in the inward direction. Such a portion in a rest position is shown in FIG. 18. This particular rest position can for instance be obtained by putting the stamping layer 120 into contact with the base layer 110 at a lower temperature than the working temperature. In case of the temperature being brought to the working temperature for the purpose of a printing action, the stamping layer 120 expands and buckles into the funnels 172 of the capillaries 170.

It is well known that a buckle is bi-stable. Therefore, if the pressure in a certain capillary 170 is increased, an associated buckled portion of the stamping layer 120 at a certain point switches over to a pushed out position. In FIG. 19, a buckled portion in the pushed out position is shown, touching the receiving surface 21 of a substrate 20.

When the buckled portion is in the pushed out position as shown in FIG. 19, and the pressure exerted by the associated capillary 170 is still increased, the buckled portion is brought into an enhanced pushed out position, wherein the contact surface between the buckled portion and the receiving surface 21 is increased, as shown in FIG. 20. Using this technique of still increasing the pressure, it is possible to modulate the size of a single printed dot on the receiving surface 21, thereby optimizing and speeding up the printing of the entire receiving surface 21.

FIG. 21 diagrammatically shows a sectional view of a portion of a stamp 30, wherein the base layer 110 is provided with notches 113 for receiving protrusions 124 being situated at the bottom surface 22 of the stamping layer 120. In this way, good fixation of the stamping layer 120 on the base layer 110 is ensured.

In order to avoid pressure leaking from one printing dot 123 to an adjacent printing dot 123, the notches 113 and the protrusions 124 are preferably made into trenches that completely surround a printing dot 123 and the associated funnel 172. The trenches may have a rectangular circumference, as shown in FIG. 22, which shows a bottom view of a portion of the stamp 4, wherein the notch 13, the protrusion 24 and the upper circumference of the funnel 172 are depicted by means of dashed lines.

On the other hand, especially in case of the stamping layer 120 not being provided with printing dots 23, it may be desirable to allow pressure to leak from one portion associated with a capillary 170 to an adjacent portion, for instance in order to allow printing in continuous lines by controlling the pressure in the capillaries 170 such that rows of portions of the stamping layer 120 associated with the capillaries 170 are subjected to more or less the same pressure. In such case the notches 113 and the protrusions 124 formed as trenches may be left out.

A possibility for aligning square printing dots 23 is shown in FIG. 23. In this possibility, the length L of the sides of the printing dots 23 is 1 μm, and the printing dots 23 are positioned in pairs at a mutual distance D of 2 μm. Subsequent pairs of printing dots 23 are mutually displaced at an effective pitch P of 0.5 μm. The printing dots 23 are positioned in two rows of six pairs each, wherein said two rows are positioned at a mutual distance R of 1.5 μm.

The substrate 30, which is not shown in FIG. 23, is moved in the direction in which the pairs of printing dots 23 are positioned in the rows, as indicated by arrow M in FIG. 23. The substrate 30 may be moved at discrete steps of 1 μm.

With six pairs in one row, all possible prints in a direction at right angles with the direction of movement of the substrate 30 are covered, as a first printing dot 123 of the sixth pair overlaps the second printing dot 123 of the first pair in said direction. With the mutual distance R of 1.5 μm between the two rows, all possible prints in the direction of movement of the substrate 30 are covered.

It will be understood that FIG. 23 shows only one of the many possibilities of the pattern according to which the printing dots 23 may be positioned. It will further be understood that the actuators 60 are positioned according to a corresponding pattern. In case of the printing dots 23 not being present, the alignment of the actuators 60 determines the possibilities for the pattern to be printed.

In FIG. 24, an example is shown of a printed pattern being obtained by using a stamp having printing dots 23 which are aligned in the way as shown in FIG. 23. The lines in the pattern indicate prints of the sides of the printing dots 23 that are utilized. In this example of an obtained pattern, the maximum distance between the lines is 0.5 μm in both directions, indicating that overlapping printing dots 23 have been utilized.

In actual practice, due to design constraints, the pitch P could be as large as ten times the length L of the sides of the printing dots 23. In case of the length L being 1 μm, the pitch P would then be 10 μm. With such an alignment of the printing dots 23, the printing dots 23 need to be printed at 100 positions to cover an entire receiving surface 21. If the printing dots 23 are moved at a frequency of 50 Hz, printing of one substrate 20 would take 2 seconds.

EXAMPLE 1

A wave printing apparatus of the kind shown in FIG. 1, however with capillaries as shown in FIG. 15 was used for transferring a fluid layer. The capillaries were filled with air at a low pressure. The base layer and the stamping surface were held together in through vacuum suction. The stamping surface was brought towards the receiving surface through the provision of air into the capillaries. A solution of $Fe(NO_3)_3.9H_2O$ in water was provided on the stamping surface. Hereafter the solvent was evaporated passively for about 30 seconds. Then local areas of the stamping surface were brought to the receiving surface one after the other, according to a wave pattern. According to the pattern at the stamping surface, which included squares of about 2*2 microns, the fluid layer of iron nitrate was transferred to the receiving surface. Subsequently, carbon nanotubes were grown selectively. These were found to adhere only at the transferred areas. This shows that the transfer of the fluid layer was successful and provided the desired pattern.

EXAMPLE 2

The same wave printing as used in Example 1, was provided with a stamping surface having a pattern suitable for the printing of lines. In this example, a solution of organometallic compounds in a polar solvent was used. In this case the metallic compound was silver. Colloidal silver (6 g, ex Merck) was added to 20 g of water and rolled for one night on a roller conveyer and the sol dispersion was filtered over a 200 nm filter. A composition contained 40 mg methyl trimethoxysilane (MTMS), 0.86 g tetraethoxysilane (TES), 32 g water, 4.5 g ethanol and 0.14 g glacial acetic acid. It was hydrolyzed for 48 h. 0.09 g of this hydrolyzed mixture were added to 4 g of the above silver sol dispersion under continuous stirring, to give a silver-containing layer comprising 10 vol % of MTMS (assuming a density of 2 g/ml of MTMS). Silver-containing layers were spincoated onto 1% HF cleaned glass plates. The layer was dried at 100° C. Hereafter the stamping surface was brought into contact with the glass plate with the silver sol at local areas. According to the pattern at the stamping surface, the silver sol was transferred to the stamping surface of the stamp. The adhesion of the silver sol is sufficient to deposit some material at the stamping surface, and sufficiently low to transfer the printable material to the receiving surface. This transfer was done subsequently. Finally the silver sol was cured at 250° C. for 30 minutes, followed by a further heat treatments at 350, 450, 500 and 550° C. for 30 minutes. The resulting pattern showed silver lines having a width of about 40 μm. No bulges or deformations of the lines could be observed.

It will be clear to a person skilled in the art that the scope of the present invention is not limited to the examples discussed in the foregoing, but that several amendments and modifications thereof are possible without deviating from the scope of the invention as defined in the attached claims.

The substrate 20 and the stamp 30 can have any suitable shape. The present invention is in the first place intended to be applied in situations where substrates 20 having substantially flat receiving surfaces 21 are utilized. Nevertheless, the present invention is also suitable to be applied in other situations, for example where substrates 20 having a convex receiving surface 21 are utilized. Preferably, in the described apparatus according to the invention, the actuators are arranged so as to act in a direction substantially perpendicular to the receiving surface 21.

As described in the foregoing, transfer areas between a stamping surface 31 and a receiving surface 21 are created by successively moving portions of the stamping surface 31 in the direction of the receiving surface 21 or by successively moving portions of the receiving surface 21 in the direction of the stamping surface 31. It is also possible to move corresponding portions of the stamping surface 31 as well as the receiving surface 21 simultaneously in order to create the transfer areas.

Instead of being secured along its circumference, the stamp 30 can be mounted on a carrier. Such a carrier can for example be shaped like a cylinder or a part of a cylinder having a relatively large diameter. Preferably, such a carrier provides the stamp 30 with stiffness in the x-direction and the y-direction, and not in the z-direction.

The invention claied is:

1. A method for transferring a pattern to a receiving surface of a substrate, in which a stamp having a stamping surface is utilized, at least one of the stamping surface and the receiving surface being flexible, the method comprising the following steps:

positioning the stamp and the substrate with respect to each other, in such a way that the stamping surface and the receiving surface face each other;

fixing the positions of the stamp and the substrate with respect to each other in a direction in which the receiving surface extends;

moving a first portion of at least one of the stamping surface and the receiving surface forward and backward in a direction substantially perpendicular to the receiving surface, such that during a first transfer period a first transfer area is created between the stamping surface and the receiving surface, in which the stamp is able to locally transfer the pattern to the substrate; and subsequently moving a second portion of at least one of the stamping surface and the receiving surface forward and backward in a direction substantially perpendicular to the receiving surface, such that during a second transfer period a second transfer area is created between the stamping surface and the receiving surface, in which the stamp is able to locally transfer the pattern to the substrate.

2. The method of claim 1, wherein the duration of the first transfer period and the duration of the second transfer period are substantially equal to each other.

3. The method of claim 2, wherein the first transfer period and the second transfer period partly overlap.

4. The method of claim 1, wherein the first portion and second portion are adjacent portions.

5. The method of claim 1, wherein the pattern is provided at the stamping surface of the stamp.

6. The method of claim 1, wherein at least the second transfer area is shaped like a ring.

7. The method of claim 1, wherein the first transfer area and the second transfer area are linear.

8. The method of claim 1, wherein the first portion and the second portion are successively subjected to pressure in order to successively move the first portion and the second portion.

9. A method of manufacturing an electronic device comprising the step of transferring a pattern to a receiving surface of a substrate as claimed in claim 1.

* * * * *